United States Patent
Sorbel et al.

(10) Patent No.: US 10,935,702 B2
(45) Date of Patent: Mar. 2, 2021

(54) REFLECTION AND DIFFRACTION CONTROL WITH SLANTED SEMICONDUCTOR METAMATERIALS

(71) Applicant: NORTHROP GRUMMAN SYSTEMS CORPORATION, Falls Church, VA (US)

(72) Inventors: Scott R. Sorbel, Redondo Beach, CA (US); Katherine T. Fountaine, Manhattan Beach, CA (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 263 days.

(21) Appl. No.: 15/943,172

(22) Filed: Apr. 2, 2018

(65) Prior Publication Data

US 2019/0302325 A1 Oct. 3, 2019

(51) Int. Cl.
*G02B 5/00* (2006.01)
*H01L 31/0352* (2006.01)
(Continued)

(52) U.S. Cl.
CPC ............ *G02B 5/003* (2013.01); *G02B 1/111* (2013.01); *H01L 29/0676* (2013.01); *H01L 31/035227* (2013.01); *G02B 2207/101* (2013.01)

(58) Field of Classification Search
None
See application file for complete search history.

(56) References Cited

U.S. PATENT DOCUMENTS 9,263,519 B2 * 2/2016 Lal .................... B82Y 10/00
2006/0207647 A1 * 9/2006 Tsakalakos ............ B82Y 20/00
136/256
(Continued)

FOREIGN PATENT DOCUMENTS

EP 2241909 A2 * 10/2010 ............. G02B 1/118
WO 20110047359 A2 4/2011

OTHER PUBLICATIONS

RefractiveIndex.INFO website, Copyright 2008-2020 Mikhail Polyanskiy, https://refractiveindex.info/?shelf=main&book=InP&page=Pettit, accessed on Sep. 11, 2020. (Year: 2020).*
(Continued)

*Primary Examiner* — Derek S. Chapel
(74) *Attorney, Agent, or Firm* — John A. Miller; Shumaker, Loop & Kendrick, LLP

(57) ABSTRACT

An absorption element for absorbing radiation incident on the element at a certain wavelength band. The element includes a surface defining a normal direction perpendicular to the surface. The element also includes an array of a plurality of spaced apart nano-pillars extending from the surface at an angle orientation other than the normal direction, which creates angular asymmetry so as to increase the element's absorption response in a particular direction. The nano-pillars are made of a suitable semiconductor material and have a size relative to the wavelength band to absorb the radiation. In one non-limiting embodiment, the nano-pillars are angled at 45° relative to the normal direction and are cone-shaped to broaden their absorption capabilities.

17 Claims, 3 Drawing Sheets

(51) Int. Cl.
*H01L 29/06* (2006.01)
*G02B 1/111* (2015.01)

(56) References Cited

U.S. PATENT DOCUMENTS

| | | | | |
|---|---|---|---|---|
| 2010/0108131 | A1* | 5/2010 | Guha | H01L 31/035227 136/255 |
| 2013/0052762 | A1* | 2/2013 | Li | B82Y 10/00 438/22 |
| 2013/0092222 | A1 | 4/2013 | Nabet | |
| 2014/0191354 | A1 | 7/2014 | Vineis | |
| 2015/0303332 | A1* | 10/2015 | Chang | H01G 9/2031 136/256 |
| 2017/0052182 | A1* | 2/2017 | Black | G01N 21/6428 |
| 2017/0301810 | A1* | 10/2017 | Dutta | H01L 31/03529 |

OTHER PUBLICATIONS

RefractiveIndex.INFO website, Copyright 2008-2020 Mikhail Polyanskiy, https://refractiveindex.info/?shelf=main&book=InP&page=Aspnes, accessed on Sep. 11, 2020. (Year: 2020).*

Han, Ning, Wang, Fengyun, Ho, Johnny C.: "One-dimensional nanostructured materials for solar energy harvesting"; http://www.researchgate.net/publication/249316276.

Li, Xiuling; "Metal assisted Chemical etching for high aspect ratio nanostructures: A review of characteristics and applications in photovoltaics", Current Opinion in Solid State and Materials Science, vol. 16, No. 2, Apr. 1, 2012, pp. 71-81.

Fischer, C, Menezes, J.W., Moshkalev, S.A., Verissimo, C., Vaz, A.R. and Swart, J.W.; "Fabrication of high-aspect ratio silicon nanopillars and nanocones using deepreactive ion etching"; J.Va. Sci. Technol. B 27(6), Nov./Dec. 2009, 2009 American Vacuum Society; pp. 2732-2736.

Kandziolka, Michael, Charlton, Jennifer J., Kravchenko, Ivan I., Bradshaw, James A., Merkulov, Igor A., Sepaniak, Michael J., Lavrik, Nickolay V.; "Silicon Nanopillars as a Platform for Enhanced Fluorescence Analysis"; ACH Publications; dx.doi.org/10.1021/ac401500y; Analytical Chemistry 2013, 85; pp. 9031-9038.

Han, Ning, Wang, Fengyun, Ho, Johnny C.: "One-dimensional nanostructured materials for solar energy harvesting"; http://www.researchgate.net/publication/249316276, Jan. 2012.

Cheung, Chin Li, Nikolic, R.J., Reinhardt, C.E., Wang, T.F.; University of Nebraska—Lincoln; DigitalCommons@Univeristy of Nebraska—Lincoln; "Fabrication of nanopillars by nanosphere lithography"; Mar. 2006; Barry Chin Li Cheung Publications; http://digitalcommons.unl.edu/chemistrycheung/4.

Fountaine, Katherine T., Cheng, Wen-Hui, Bukowsky, Colton R., Atwater, Harry A.; pubs.acs.org/journal/apchd5; ACS Photonics 2016, 3, pp. 1826-1832; Published Sep. 26, 2016.

* cited by examiner

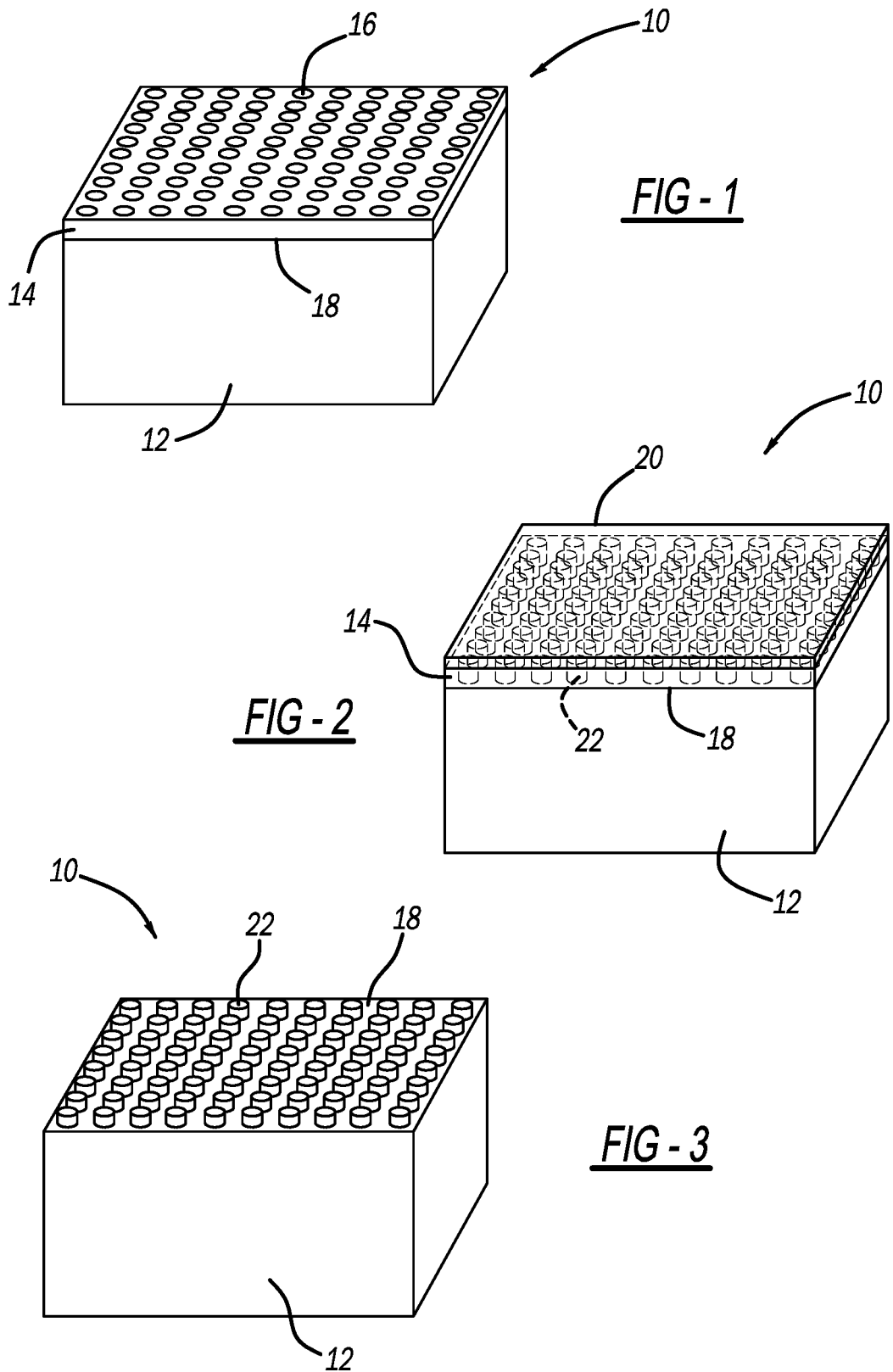

REFLECTION AND DIFFRACTION CONTROL WITH SLANTED SEMICONDUCTOR METAMATERIALS

BACKGROUND

Field

This disclosure relates generally to an absorption element that absorbs radiation at certain wavelengths and, more particularly, to an optical absorption element that includes an array of nano-pillars that are angled relative to normal, which creates angular asymmetry so as to increase the element's absorption response in a particular direction.

Discussion

The absorption of electromagnetic waves at certain wavelengths that is relatively broadband and is incident angle and polarization insensitive is desirable for many applications. For example, it may be desirable to have a high degree of absorption of a communications signal received by a receiver over a broad bandwidth and a broad angular range. However, most materials reflect much of the energy incident on the surface of the material, where the reflection increases as the angle of incidence (AOI) of the radiation beam approaches the grazing angle for both S and P polarizations. This reflection characteristic of a material is primarily due to the Fresnel conditions that describe the behavior of light when moving between media having different indexes of refraction, for example, from air to a waveguide. It is known that by making the surface interface of the material nano-structured, where the size of a unit cell of the structure is much smaller than the incident beam wavelength, absorption of the beam can be improved. For example, by providing cylindrical nano-posts, enhanced absorption of radiation due to strong coupling into the first order azimuthal waveguide modes of the individual nano-structures may be realized.

Optical absorption elements are known in the art that include an array of semiconductor nano-pillars, such as germanium nano-pillars. These nano-pillars are capable of trapping and hence absorbing light because of their relatively large surface area. Studies have shown that semiconductor nano-pillar arrays are sensitive to incoming electromagnetic fields, which can affect the efficiency of the structure when absorbing energy, such as packing density and pillar height. Typically, graded type structures allow for grading of the index of refraction from one medium to another, which helps minimize reflections. Nano-pillars allow this control as a way to help ease the incoming electromagnetic energy from seeing too large of a perturbation when transitioning from one medium to another.

Some known nano-structure designs employ dual diameter nano-pillars that are effective for trapping energy, and thus, absorbing light without employing anti-reflecting treatments. By employing dual diameter nano-pillars, more energy from the incident light can be absorbed as compared to the absorption by nano-pillars having the same diameter along their entire length. Other shapes besides cylinders have been considered in the art, such as squares, rectangles, hexagons, etc., to investigate cell geometry structure versus the dispersive reflection properties.

Although there have been advancements in the development of novel materials for reflection control to increase the absorption performance of absorber elements, additional improvements can be made by manipulating local electromagnetic fields. Silicon nano-pillars exhibit unique optical behavior at small scales, such as field enhancement on their surfaces, and demonstrate their potential in improving the performance of reflection at different AOIs. Electron beam lithography and wafer scale processes can create silicon nano-pillars with dimensions that can be tuned to maximize enhancement in a particular spectral region. Other techniques that may be useful for absorption in the infrared regime of the electromagnetic spectrum employ a self-assembly process where monolayers of polystyrene nano-spheres (PSNSs) are coated with $SiO_2$ by oblique evaporation at a deposition angle of 70°. After the PSNSs are removed by annealing in air at 650° C., periodic arrays of $SiO_2$ nano-spherical crowns (NSCs) remain. On the NSC template, Si and Fe are deposited alternatively at a deposition angle of 80° and a substrate temperature of 470° C. Due to the strong shadowing effect, non-close-packed nano-pillar arrays of beta-$FeSi_2$ can be fabricated. Periodic arrays of beta-$FeSi_2$ are useful to manipulate temperature and could have interesting performance metrics for IR applications of interest.

In addition, low cost nano-sphere lithography methods for patterning and generation of semiconductor nano-structures provide a potential alternative to the conventional top-down fabrication techniques. Silicon nano-pillar "forests" with 10's to 100's of nm geometries and aspect ratios of up to ten have been fabricated with cost-effective options that use a combination of nano-sphere lithography and deep reactive ion etching. To produce nano-pillars of different length, diameter and density, the nano-sphere etch mask coated silicon substrates may be etched using oxygen plasma and a time-multiplexed process.

Future fabrication of nano-pillars may also contain axial and radial core-shell heterostructures with well-defined interfaces. The growth of uniform arrays of nano-pillars with diameters from 100 nm to 200 nm and heights of several microns provided by metal-organic chemical vapor deposition (MOCVD) selective area epitaxy on patterned silicon could result in electronic confinement in multiple dimensions and decrease rates of electron-phonon scattering, hence providing higher quantum efficiency materials operating at longer wavelengths.

Optical absorption elements employing semiconductor nano-pillars have been shown to be effective for absorbing light. However these optical elements have certain limitations. For example, it has been shown that the radius of the nano-pillars controls the spectral absorption and that cylindrical nano-pillars having a uniform radius exhibit relatively narrowband absorption. Further, it is known that optical absorption elements having nano-pillars configured perpendicular to normal relative to a substrate are generally only effective in absorbing light that is incident onto the substrate at an angle of ±45° relative to normal. Thus, light incident on the element from an angle between 45° to normal and the grazing angle is not efficiently absorbed.

BRIEF DESCRIPTION OF THE DRAWINGS

FIGS. 1-4 show a series of fabrication steps for fabricating an optical absorption element having angled and cone-shaped nano-pillars;

DETAILED DESCRIPTION OF THE EMBODIMENTS

The following discussion of the embodiments of the disclosure directed to an optical absorption element including an array of nano-pillars that are angled relative to normal to create angular asymmetry of the element's absorption response is merely exemplary in nature and is in no way intended to limit the disclosure or its applications or uses.

The present disclosure proposes a radiation absorption element having an array of shaped nano-pillars being made of a suitable semiconductor material and being angled relative to the normal direction for increasing the absorption capability of the element over a relatively wide bandwidth for a certain beam direction. When an elementary semiconductor material, such as silicon, is etched or grown into a tapered cone structure on a sub-wavelength basis, different reflection and absorption properties are observed. More particularly, every material has its own characteristic energy-band structure. This variation in band structure is responsible for a wide range of electrical characteristics observed in various materials. In semiconductors and insulators, electrons are confined to a number of bands of energy, and forbidden from other regions. The term "band gap" refers to the energy difference between the top of the valence band and the bottom of the conduction band. Electrons are able to jump from one band to another. However, in order for an electron to jump from a valence band to a conduction band, it requires a specific minimum amount of energy for the transition. The required energy differs with different materials. Electrons can gain enough energy to jump to the conduction band by absorbing either a phonon (heat) or a photon (light). Each of the materials considered here have their own bandgap and this helps determine its dispersive characteristics.

Accurate modeling of the nano-pillars over a large bandwidth for different angles of incidence and polarizations is a challenging problem. The variation of the resonant frequency, bandwidth and harmonics with respect to polarization and angles of incidence must be considered. In addition, the process of finding the proper semiconductor material that is able to match the large bandwidth requirements for different polarizations and incident angles may be quite complicated. The equivalent effective index of refraction would have a complicated dependence on polarization and angle of incidence for certain types of periodic arrays.

Figure 4:
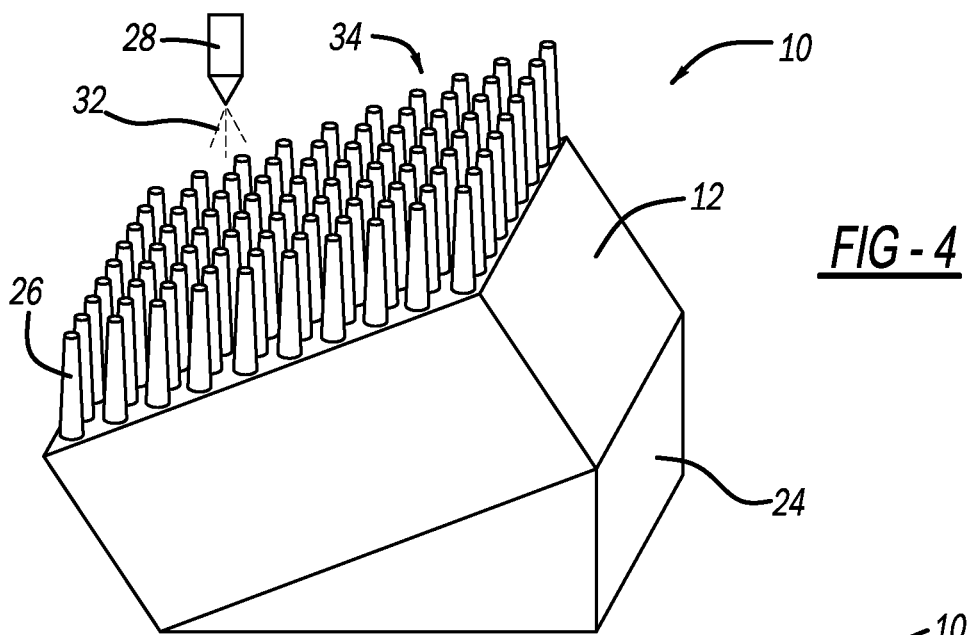
Figure 5:
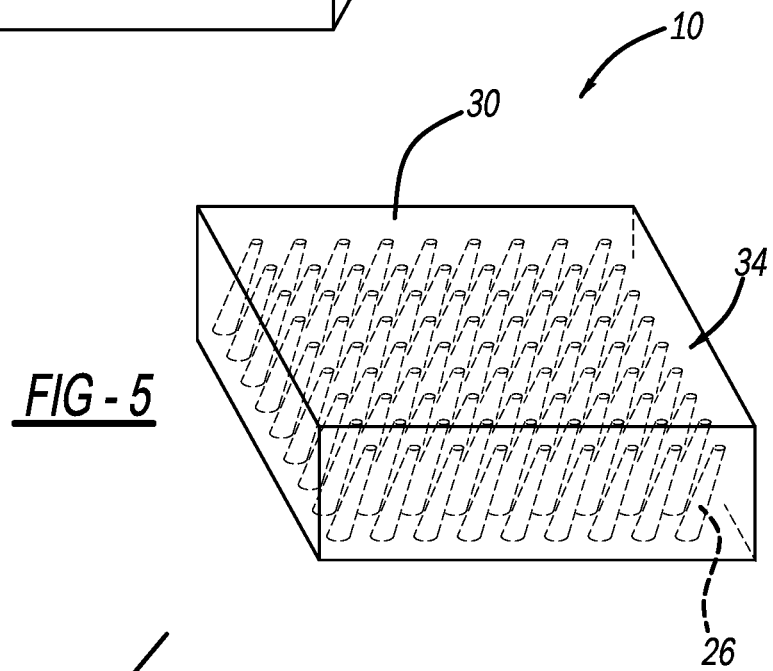
FIG. 5 is an isometric view of the final fabricated optical absorption element.

FIGS. 1-4 are a series of isometric views showing a process for fabricating an optical absorption element 10, where the final fabricated element 10 is shown in FIG. 5. It is noted that the process described herein for fabricating the optical element 10 is merely by example in that variations of this process and other processes can be performed to obtain the final absorption element 10. It is further noted that although the element 10 is specifically designed for absorbing radiation in the optical spectrum, other absorption elements can be provided consistent with the discussion herein for other wavelength bands.

FIG. 1 shows a semiconductor wafer or substrate 12 made of a suitable semiconductor material, where the best semiconductor materials for absorption will typically be high index semiconductor materials at wavelengths less than the material's bandgap and having high loss for the frequency band of interest. Suitable semiconductor materials may include indirect bandgap materials, such as a-Si, III-V semiconductor materials, such as GaN, GaAs, InP, InSb, ternaries and quarternaries, etc., CdTe, CZTSSe, CIGS, perovskites, BiTe, etc., and indirect bandgap materials, such as a-Si, III-V semiconductor materials, such as GaP, ternaries and quarternaries, etc. In one non-limiting embodiment, three different types of semiconductor materials are proposed herein for broadband optical radiation absorption, and include InP for visible light, Si for visible and near infrared (NIR) light, and InSb for mid-wave IR (MWIR) light. When considering materials, such as bismuth telluride ($Bi_2Te_3$), for long-wave IR (LWIR) light, the semiconductor material bandgap energy must be carefully designed.

The substrate 12 has a relatively flat top surface 18 on which a photoresist layer 14 is spun by any suitable photoresist deposition process. An electron beam lithography process is then performed to pattern a top surface of the photoresist layer 14 to define the locations where nano-posts will be created. The photoresist layer 14 is then developed in a suitable solution so that electron beam exposed portions of the photoresist layer 14 are dissolved to form suitably configured holes 16 in the layer 14, here circular holes for this non-limiting embodiment.

Next, a mask layer 20 is deposited on the photoresist layer 14 that fills the holes 16, where any suitable mask material can be used, such as chromium, as shown in FIG. 2. Next the photoresist layer 14 is dissolved by a suitable chemical in a lift-off process so that all that remains on the substrate 12 are cylindrical caps 22 of the mask material, as shown in FIG. 3. The element 10 is then placed on a tilted stage 24 or other wedge-shaped device that is positioned to perform a reactive ion dry etch into the substrate 12 to form an array 34 of conical-shaped nano-pillars 26 at an angle relative to the surface 18 of the substrate 12 other than 90° as determined by the angle of the stage 24, where the largest diameter of the nano-pillars 26 is at the substrate 12 and the smallest diameter of the nano-pillars 26 is opposite to the substrate 12, as shown in FIG. 4. In an alternate embodiment, the largest diameter of the nano-pillars 26 can be opposite the substrate 12 and the smallest diameter of the nano-pillars 26 can be at the substrate 12. In this non-limiting embodiment, the stage 24 and thus the nano-pillars 26 are angled at 45° relative to the surface 18 and normal. The reactive ion dry etch also removes all or most of the caps 22. It is noted that although the array 34 of the nano-pillars 26 is shown having a square or rectangular shape or configuration, this is by way of a non-limiting example. The array 34 can have any shape stable for a particular application, such as hexagonal or aperiodic.

The reactive ion etch uses high energy ions 32 from an ion source 28 to remove portions of the substrate 12 around the caps 22 to a certain depth that defines the length of the nano-pillars 26. Any suitable dry etch process can be employed, such as inductively coupled plasma reactive ion etch (ICP-RIE), deep reactive ion etch (DRIE), etc., that allows the desired depth of the etch with limited undercutting of the caps 22. The source 28 is positioned so that it directs the ions 32 towards the element 10 generally perpendicular to the surface 18 if the element 10 was not mounted to the stage 24 to obtain the desired angle orientation of the nano-pillars 26. Once the nano-pillars 26 have been formed, the nano-pillars 26 can be encapsulated in a protective coating 30, such as a PDMS (polydimethylsiloxane) coating or any other suitable protective low index material. The encapsulated nano-pillars 26 are then peeled off the remaining portion of the substrate 12 to provide the final element 10, as shown in FIG. 5. Electrical wires (not shown) are connected to the nano-pillars 26 in any suitable manner to send the absorbed signal to the desired location. In an alternate design, the element 10 can also emit radiation.

By angling the nano-pillars 26 relative to the normal direction the element 10 has angular asymmetry when looking down on the element 10 from the normal direction. This allows the element 10 to have a better absorption response to incident radiation from the direction that the nano-pillars 26 are facing. In other words, by directing the nano-pillars 26 towards one direction and away from an opposite direction, the element 10 will have better absorption in that direction than it would if the nano-pillars 26 were facing upwards in the normal direction. Since absorption of an incident beam will best occur in a direction ±45° relative to the direction the nano-pillars 26 are facing, then a 45° oriented nano-pillar will absorb radiation between normal and the grazing angle for that side of the element 10, whereas radiation will not be significantly absorbed between 45° and the grazing angle if the nano-pillars 28 were facing in the vertical normal direction. Therefore, if the general direction of the incoming radiation beam is known, then angling the nano-pillars 26 in that direction improves the absorption while at the same time reduces noise from other directions. Other embodiments may require the nano-pillars 26 to be angled at other angles for the best absorption depending on the direction of the incident radiation. In fact, the angle of the nano-pillars 26 may have application anywhere from 1° relative to normal all of the way to grazing angle, i.e., the angle where all of the beam would be reflected from the surface 18.

As mentioned, the nano-pillars 26 are conical-shaped. By making the nano-pillars 26 shaped in this manner where they do not have a constant diameter over their length the absorption characteristics of the element 10 are improved to be more broadband to absorb radiation over a wider bandwidth, and thus more effective for certain absorption applications. It is stressed however that pillar shapes having other configurations may be equally applicable, for example, circles, ellipses, any polygon shapes, such as triangles, squares, rectangles, diamonds, quadrilateral, pentagon, hexagon, septagon, octagon, stars, etc., spirals, helices, wavy, etc. Further, multiple cross-sectional shapes can be incorporated into a single nano-pillar where the nano-pillar would transition to different shapes when moving along its length.

The selected length and the diameter of the nano-pillars 26 would depend on the desired wavelength band to be absorbed. Generally, for a direct bandgap material, the length of the nano-pillars 26 would typically be at least two times the center wavelength of the band divided by the real part of the material refractive index, where longer lengths may provide better performance, and the diameter of the nano-pillars 26 would typically be about the center wavelength of the band divided by the real part of the material refractive index. For indirect bandgap materials, the length of the nano-pillars 26 would typically be much longer than two times the center wavelength of the band divided by the real part of the material refractive index. Specific lengths and diameters of the nano-pillars 26 could be about 1 μm in length and about 50-200 nm in diameter for GaAs and InP semiconductor materials and absorption wavelength bands between 400 and 900 nm; about 5 μm in length and about 200 nm-1 μm in diameter for InSb semiconductor materials and absorption wavelength bands between 1.5 and 5.5 μm; and about 10 μm in length and about 50 nm-5 μm in diameter for c-Si semiconductor materials and absorption wavelength bands between 400 nm and 1.1 μm. Other examples include, for absorbing visible light, where the substrate 12 may be InP, each nano-pillar 26 may be 80 nm in diameter at its narrowest point, 200 nm in diameter at its largest point and 3 μm in length, and for absorbing MWIR, where the substrate 12 may be InSb, each nano-pillar 26 may be 200 nm in diameter at its narrowest point, 1100 nm in diameter at its largest point and 15 μm in length.

Figure 6:
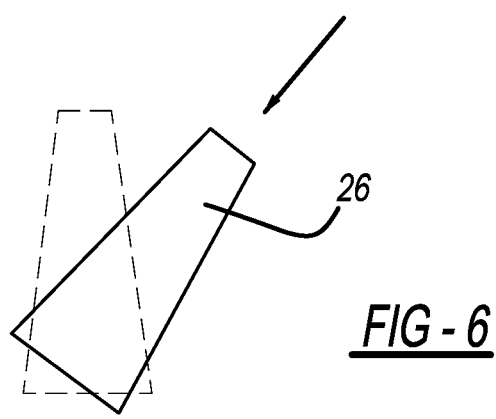
FIG. 6 is a side view of one of the nano-pillars separated from the optical element shown at a 45° angle in solid and at a normal angle in phantom.

In the non-limiting embodiment discussed above, the nano-pillars 26 are formed at a 45° angle relative to the surface 18. FIG. 6 is a side view of one of the nano-pillars 26 separated from the element 10 and being shown in the 45° angle orientation in solid lines and at the normal angle in phantom, where the direction of an incoming optical beam is shown by the arrow. This configuration shows that the most effective absorption is obtained when the nano-pillars are directly pointed at the incoming beam. This orientation of the nano-pillars 26 provides a suitable absorber for radiation incident on the element 10 from any direction in the hemisphere on that side of the element between normal and the grazing angle, where radiation is not absorbed between normal and the grazing angle in the opposite hemisphere.

Figure 7:
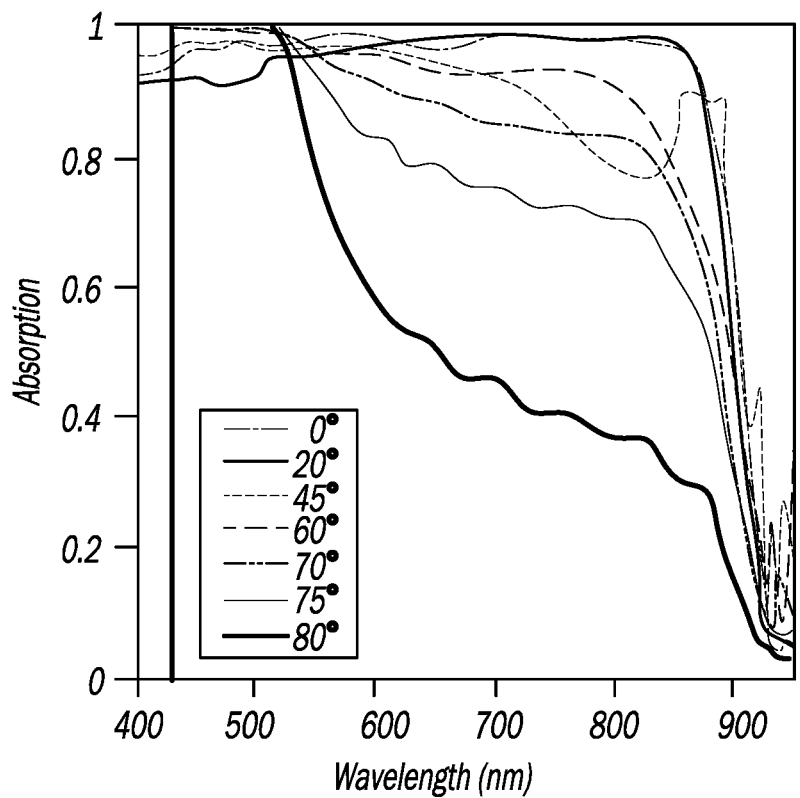
FIG. 7 is a graph with wavelength on the horizontal axis and absorption on the vertical axis showing the absorption characteristics of an optical absorption element having nano-pillars directed in the normal direction for several wavelengths of unpolarized light.
Figure 8:
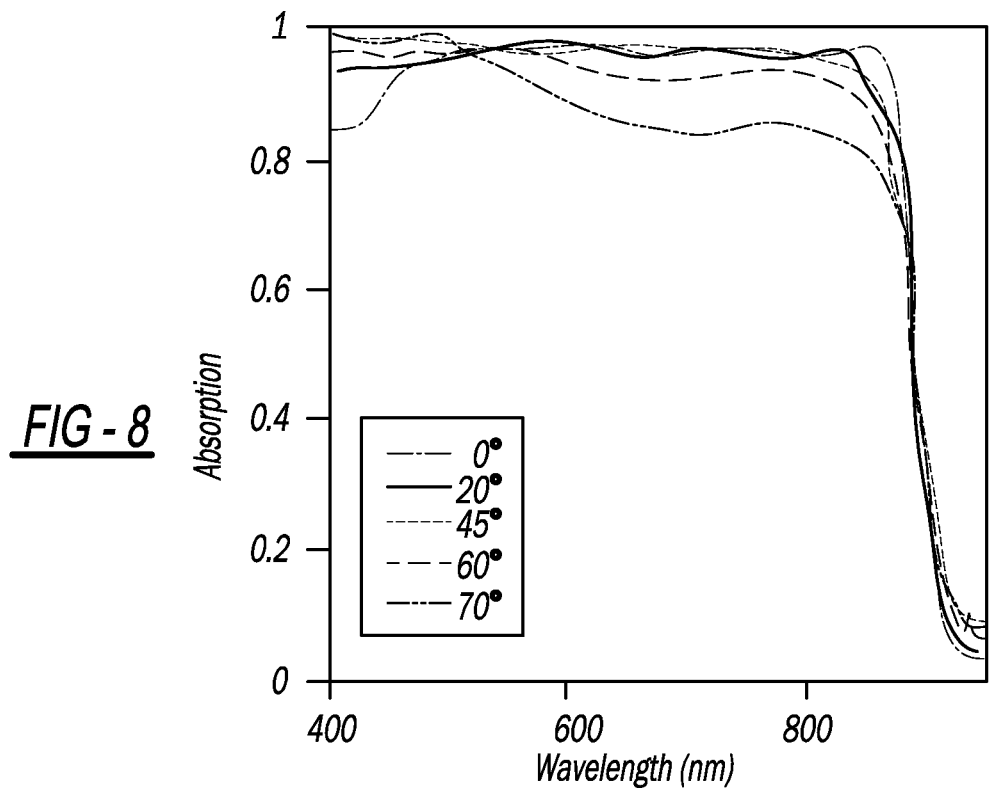
FIG. 8 is a graph with wavelength on the horizontal axis and absorption on the vertical axis showing the absorption characteristics of an optical absorption element having cone-shaped nano-pillars directed 45° relative to the normal direction for several wavelengths of unpolarized light.

FIG. 7 is a graph with wavelength on the horizontal axis and absorption on the vertical axis showing the absorption performance of the normal oriented nano-pillar for beam incidence angles of 0°, 20°, 45°, 60°, 70°, 75° and 80°. FIG. 8 is the same graph but for the 45° angle oriented nano-pillar 26 for beam incidence angles of 0°, 20°, 45°, 60° and 70°, and showing a better absorption performance. For example, FIG. 7 shows a dip in the absorption of the beam angle of 45° around 800 nm, but FIG. 8 shows no dip at this wavelength for the 45° oriented nano-pillars 26.

The foregoing discussion discloses and describes merely exemplary embodiments of the present disclosure. One skilled in the art will readily recognize from such discussion and from the accompanying drawings and claims that various changes, modifications and variations can be made therein without departing from the spirit and scope of the disclosure as defined in the following claims.

What is claimed is:

1. An absorption element for absorbing radiation incident on the element at a certain wavelength band, said element comprising:
   a surface defining a normal direction perpendicular to the surface; and
   an array of a plurality of spaced apart nano-pillars extending from the surface at an angle orientation relative to the surface other than in the normal direction, said nano-pillars having a cross-sectional diameter and length relative to the wavelength band to absorb the radiation, wherein all of the nano-pillars are angled directly from and relative to the surface in the same angle orientation so as to increase absorption of radiation in one direction and reduce absorption of radiation in a substantially opposite direction, and wherein the nano-pillars are cone-shaped so that the cross-sectional diameter of each nano-pillar is not consistent from one end of the nano-pillar to an opposite end of the nano-pillar.

2. The element according to claim 1 wherein the angle orientation of the nano-pillars is between 1° relative to the normal direction and a grazing angle of the surface.

3. The element according to claim 2 wherein the angle orientation of the nano-pillars is 45° relative to the normal direction.

4. The element according to claim 1 wherein a widest diameter of each nano-pillar is at the surface and a narrowest diameter of each nano-pillar is opposite to the surface.

5. The element according to claim 1 wherein the array of nano-pillars is made of a semiconductor material.

6. The element according to claim 5 wherein the array of nano-pillars is made of a-Si, GaAs, GaN, InAs, InP, GaP, InSb, $Bi_2Te_3$, CdTe, CZTSSe, CIGS perovskites or BiTe.

7. The element according to claim 5 wherein the array of nano-pillars is either made of InP for absorbing optical radiation in the visible spectrum, Si for absorbing optical radiation in the visible and near infrared spectrum, InSb for absorbing optical radiation in the mid-wave infrared spectrum, or $Bi_2Te_3$ for absorbing optical radiation in the long wave infrared spectrum.

8. The element according to claim 1 wherein a length and diameter of the nano-pillars is selected based on the wavelength band.

9. The element according to claim 8 wherein the nano-pillars are made of a direct bandgap material, and wherein the length of the nano-pillars is at least two times a center of the wavelength band divided by a real part of the refractive index of the pillar material and the diameter of the nano-pillars is approximately equivalent to the wavelength band divided by the real part of the refractive index of the pillar material, the wavelength band varying based upon the spectrum which is optically absorbed.

10. The element according to claim 1 wherein the array of nano-pillars is encapsulated in a protective coating.

11. An optical absorption element for absorbing optical radiation incident on the element at a certain wavelength band, said element comprising:

a surface defining a normal direction perpendicular to the surface; and an array of a plurality of spaced apart cone-shaped semiconductor nano-pillars extending from the surface at an angle orientation other than in the normal direction and being configured to absorb the radiation at the certain wavelength band, said nano-pillars having a size relative to the wavelength band to absorb the radiation, wherein all of the nano-pillars are angled directly from and relative to the surface in the same angle orientation so as to increase absorption of radiation in one direction and reduce absorption of radiation in a substantially opposite direction.

12. The element according to claim 11 wherein a widest diameter of each nano-pillar is at the surface and a narrowest diameter of each nano-pillar is opposite to the surface.

13. The element according to claim 11 wherein the angle orientation of the nano-pillars is between 1° relative to the normal direction to a grazing angle of the surface.

14. The element according to claim 13 wherein the angle orientation of the nano-pillars is 45° relative to the normal direction.

15. The element according to claim 11 wherein the array of nano-pillars is made of a-Si, GaAs, GaN, InAs, InP, GaP, InSb, $Bi_2Te_3$, CdTe, CZTSSe, CIGS perovskites or BiTe.

16. The element according to claim 11 wherein the array of nano-pillars is made of either InP for absorbing optical radiation in the visible spectrum, Si for absorbing optical radiation in the visible and near infrared spectrum, InSb for absorbing optical radiation in the mid-wave infrared spectrum, or $Bi_2Te_3$ for absorbing optical radiation in the long wave infrared spectrum.

17. The element according to claim 11 wherein the array of nano-pillars is encapsulated in a protective coating.

* * * * *